United States Patent
Choi et al.

(10) Patent No.: US 9,368,743 B2
(45) Date of Patent: Jun. 14, 2016

(54) METHOD FOR FABRICATING ORGANIC LIGHT EMITTING DEVICE

(71) Applicant: Samsung Display Co., Ltd., Yongin-si, Gyeonggi-do (KR)

(72) Inventors: Hyun Ju Choi, Yongin-si (KR); Chang Ho Lee, Yongin-si (KR); Ilsoo Oh, Yongin-si (KR); HeeJoo Ko, Yongin-si (KR); Dae Yup Shin, Yongin-si (KR); KeonHa Choi, Yongin-si (KR); Changmin Lee, Yongin-si (KR); Injae Lee, Yongin-si (KR); Pyungeun Jeon, Yongin-si (KR); Sejin Cho, Yongin-si (KR); JinYoung Yun, Yongin-si (KR); Bora Lee, Yongin-si (KR); Beomjoon Kim, Yongin-si (KR); Yeon woo Lee, Yongin-si (KR); Ji Hye Shim, Yongin-si (KR); Joongwon Sim, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 13/955,569

(22) Filed: Jul. 31, 2013

(65) Prior Publication Data

US 2014/0193936 A1   Jul. 10, 2014

(30) Foreign Application Priority Data

Jan. 4, 2013   (KR) .................. 10-2013-0001239

(51) Int. Cl.
*H01L 21/00*   (2006.01)
*H01L 51/50*   (2006.01)
*H01L 51/00*   (2006.01)

(52) U.S. Cl.
CPC ........ *H01L 51/5056* (2013.01); *H01L 51/0012* (2013.01)

(58) Field of Classification Search
CPC ...................................................... H01L 51/56
USPC ...................................................... 438/46, 99
See application file for complete search history.

(56) References Cited

U.S. PATENT DOCUMENTS 5,989,737 A   11/1999   Xie et al.
6,489,046 B1   12/2002   Ikeda et al.
(Continued)

FOREIGN PATENT DOCUMENTS

JP   10-255985   9/1998
JP   2001-102172   4/2001
KR   10-2011-0104218 A   9/2011

OTHER PUBLICATIONS http://scholarbank.nus.edu.sg/bitstream/handle/10635/17693/HuangZH.pdf?sequence=1 Huang Zhaohong, PhD Thesis, National University of Singapore, 2009.*
Kim et al. "Superhydrophobic modification of gate dielectrics for densely packed pentacene thin film transistors." Applied Physics Letters (91) 063503_Aug. 7, 2007: 063503-1-063503-3.

*Primary Examiner* — Matthew Landau
*Assistant Examiner* — Igwe U Anya
(74) *Attorney, Agent, or Firm* — Robert E. Bushnell, Esq.

(57) ABSTRACT

A method of fabricating an organic light emitting device includes forming a first electrode layer on a substrate, surface-treating the first electrode layer with $CF_4$ plasma, forming a first common layer containing pentacene on the surface-treated first electrode layer, forming an organic light emitting layer on the first common layer, forming a second common layer on the organic light emitting layer, and forming a second electrode layer on the second common layer. The $CF_4$ plasma treatment enhances the luminous efficiency of the organic light emitting device.

14 Claims, 8 Drawing Sheets

(56) References Cited

U.S. PATENT DOCUMENTS

| | | |
|---|---|---|
| 2005/0140890 A1* | 6/2005 | Kim et al. ............... 349/139 |
| 2005/0153114 A1* | 7/2005 | Gupta et al. ............ 428/201 |
| 2006/0159842 A1* | 7/2006 | Gupta et al. ............ 427/66 |
| 2006/0292394 A1* | 12/2006 | Iwaki et al. ............ 428/690 |
| 2009/0284136 A1* | 11/2009 | Kawamura ............ 313/504 |
| 2010/0314614 A1* | 12/2010 | Bale et al. ............ 257/40 |
| 2011/0114929 A1* | 5/2011 | Fujita et al. ............ 257/40 |
| 2011/0203667 A1* | 8/2011 | Liao et al. ............ 136/263 |
| 2012/0153428 A1* | 6/2012 | Song et al. ............ 257/506 |

\* cited by examiner

METHOD FOR FABRICATING ORGANIC LIGHT EMITTING DEVICE

CLAIM OF PRIORITY

This U.S. non-provisional patent application claims priority under 35 U.S.C. §119 of Korean Patent Application No. 10-2013-0001239, filed on Jan. 4, 2013, the entire contents of which are hereby incorporated by reference.

BACKGROUND OF THE INVENTION

1. Field of the Invention

Embodiments of the present invention generally relate to a method for fabricating an organic light emitting device, and more particularly, to a method for fabricating an organic light emitting device that may enhance luminous efficiency.

2. Description of the Related Art

An organic light emitting device includes two electrodes and an organic light emitting layer disposed therebetween. Different common layers are disposed between the two electrodes and the organic light emitting layer, respectively. The two electrodes are classified into an anode and a cathode according to the voltage level applied thereto.

A first common layer contributing to injection/transportation of holes is disposed between the anode and the organic light emitting layer. Also, a second common layer contributing to injection/transportation of electrons is disposed between the cathode and the organic light emitting layer.

An organic light emitting device includes two electrodes and a light emitting layer disposed therebetween, and electrons injected from one electrode are combined with holes injected from the other electrode in the light emitting layer to form excitons and to emit light while the excitons emit energy.

It may be said that an organic light emitting device has high luminous efficiency when it may obtain wanted luminous effects by a low drive voltage. The luminous efficiency is generally determined by four factors, charge balance, exciton generation efficiency, internal quantum yield and luminous efficiency. Each of the four factors is influenced by the mobility of electron/hole.

SUMMARY OF THE INVENTION

Mobility of electron/hole varies with the surface characteristic of an electrode to layer and the material for a common layer of an organic light emitting device. The interfacial characteristic between the electrode layer and the common layer may be changed by performing a surface treatment or adding a new layer. The surface treatment of the electrode layer may be performed by ultraviolet (UV), plasma using an inert gas, etc. The surface treatment may change the surface crystal structure, chemical property of the electrode layer, etc. Also, the characteristics in injection/transportation of charges within the common layer may be controlled by changing the material for the common layer. Physical properties of a material, such as crystal structure of a material, component ratio of a compound, refractive index, etc. are important factors determining the luminous efficiency.

Accordingly, embodiments of the present invention provide methods for fabricating an organic light emitting device that may enhance luminous efficiency.

According to an aspect of the present invention, methods for fabricating an organic light emitting device include forming a first electrode layer on a substrate and plasma-treating an upper surface of the first electrode layer. In some embodiments, the plasma-treating may be performed by using $CF_4$ plasma. A first common layer is formed on the surface-treated first electrode layer. The first common layer contains pentacene. An organic light emitting layer is formed on the first common layer. A second common layer is formed on the organic light emitting layer and then a second electrode layer is formed on the second common layer.

In some embodiments, the forming of the first common layer may include forming a hole injection layer and forming a hole transport layer on the hole injection layer.

In other embodiments, the forming of the second common layer may include forming an electron transport layer on the organic light emitting layer and forming an electron injection layer on the electron transport layer. When the electron injection layer and the electron transport layer are disposed together, the electron transport layer may be disposed between the electron injection layer and the organic light emitting layer.

In still other embodiments, a hole blocking layer may be further disposed between the second common layer and the organic light emitting layer. The hole blocking layer blocks the movement of holes such that the holes stay in the light emitting layer. By doing so, the exciton generation efficiency may be enhanced.

According to another aspect of the present invention, methods for fabricating an organic light emitting device include forming the electron transport layer of 4,7-diphenyl-1,10-phenanthroline.

According to another aspect of the present invention, methods for fabricating an organic light emitting device include forming the first electrode layer of indium tin oxide.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE INVENTION

Figure 1:
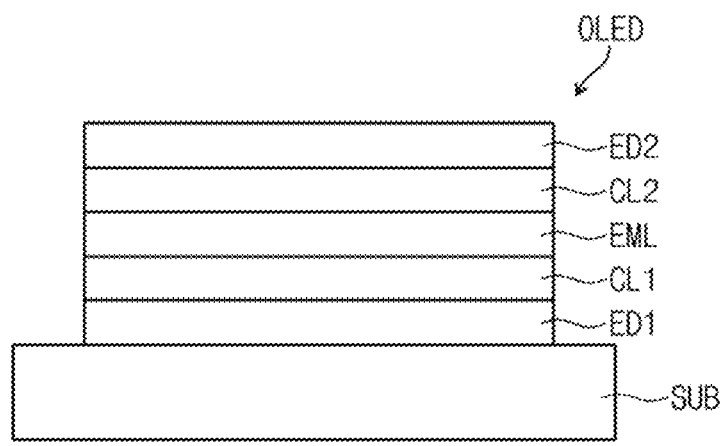
FIG. 1 is a cross-sectional view of an organic light emitting device constructed as an embodiment according to the principles of the present invention.

Hereinafter, organic light emitting devices according to embodiments of the inventive concept will be described with reference to the accompanying drawings.

In the drawings, the dimensions of layers and regions are exaggerated or downscaled for clarity. Like reference numerals in the drawings denote like elements throughout. It will also be understood that when a layer is referred to as formed (being) "on" another layer or substrate, it can be directly on the other layer or substrate, or intervening layers may also be present Although a surface of a layer is shown to be flat in the drawings, it is not required that the surface should be essentially flat, but in a stack process, a stepped portion may be generated due to the surface shape of an underlying layer.

FIG. 1 is a cross-sectional view of an organic light emitting device constructed as an embodiment according to the principles of the present invention. As illustrated in FIG. 1, an organic light emitting device (OLED) includes a first electrode layer (ED1), a first common layer (CL1), an organic light emitting layer (EML), a second common layer (CL2), and a second electrode layer (ED2). The organic light emitting device (OLED) is disposed on a substrate (SUB). The first electrode (ED1) is surface-treated by using $CF_4$ plasma while the organic light emitting device is fabricated.

The substrate (SUB) may be a glass substrate or a plastic substrate. The organic light emitting device (OLED) may be directly mounted on one surface of the substrate (SUB) or may be disposed on an insulating layer (not illustrated) on one surface of the substrate (SUB). The insulating layer may include an organic layer and/or an inorganic layer.

The first electrode layer (ED1) and the second electrode layer (ED2) receive different levels of voltage. In the present embodiment, the first electrode layer (ED1) is explained as an anode electrode, and the second electrode layer (ED2) is explained as a cathode electrode.

The anode electrode (ED1) is made of a material having high conductivity and high work function. The anode electrode (ED1) may be made of a transparent conductive oxide. For example, the anode electrode (ED1) includes indium tin oxide, indium zinc oxide, indium gallium zinc oxide, fluorine zinc oxide, gallium zinc oxide, tin oxide, zinc oxide, or the like.

The first common layer (CL1) is disposed on the anode electrode (ED1). The first common layer (CL1) includes a hole injection layer so as to facilitate injection of holes from the anode electrode (ED1). The hole injection layer may include a metal compound having the semiconductor property or may include an organic material and/or an inorganic material.

In the present embodiment, the hole injection layer includes pentacene. Pentacene has a higher hole mobility than other metal compounds, organic materials, or inorganic materials. The first common layer (CL1) including pentacene easily diffuses holes injected from the first electrode layer (ED1) into the light emitting layer (EML). The first common layer (CL1) may be formed in at least two layers, or in a single layer capable of performing both injection/transport of holes.

The organic light emitting layer (EML) is disposed on the first common layer (CL1). The organic light emitting layer (EML) generates blue light, green light, red light, or white light. The organic light emitting layer (EML) includes a fluorescent material or a phosphorescent material.

The second common layer (CL2) is disposed on the organic light emitting layer (EML). The second common layer (CL2) includes an electron injection layer so as to facilitate injection of electron from the cathode electrode (ED2). The second common layer (CL2) may be formed in at least two layers, or in a single layer capable of performing both injection/transport of electrons.

The cathode electrode (ED2) is disposed on the second common layer (CL2). The cathode electrode (ED2) is made of a material having a low work function. The cathode electrode (ED2) may include a metal such as lithium, magnesium, aluminum, or the like.

The first electrode layer (ED1) is subject to a $CF_4$ plasma treatment. The $CF_4$ plasma treatment decreases the grain size of pentacene formed on the first electrode layer (ED1). The $CF_4$ plasma treatment enhances the interfacial bonding characteristic between the first common layer (CL1) containing pentacene, and the first electrode layer (ED1), and also enhances the hole mobility. Detailed description on the $CF_4$ plasma treatment will be made with reference to FIGS. 2A and 2B.

Figure 2A:
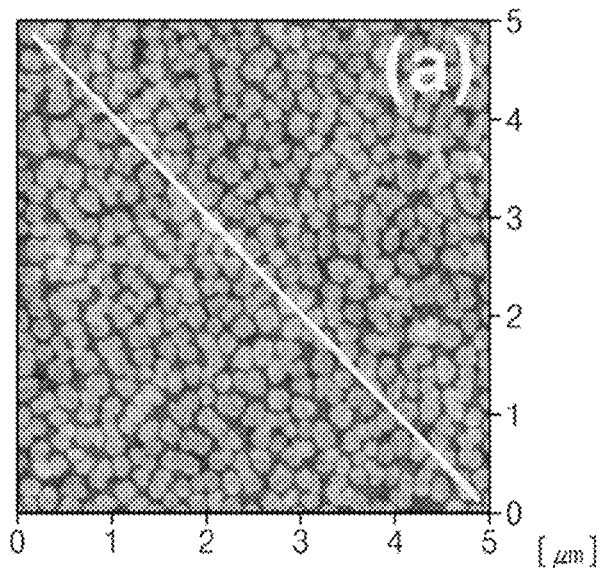
FIG. 2A is an atomic microscope image of a pentacene organic layer formed on an electrode which is not subject to a $CF_4$ plasma treatment.
Figure 2B:
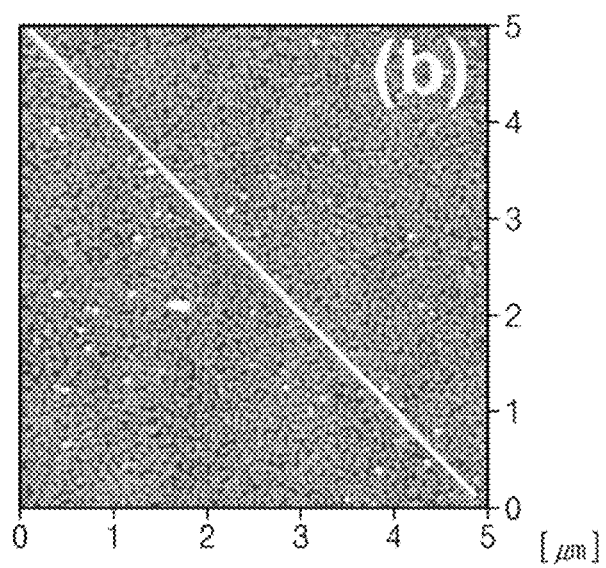
FIG. 2B is an atomic microscope image of a pentacene organic layer formed on an electrode which is subject to a $CF_4$ plasma treatment.

FIGS. 2A and 2B are atomic microscope images showing crystal grains of a pentacene thin film. Specifically, FIG. 2A shows crystal grains of a pentacene thin film stacked on an electrode layer which is not subject to a $CF_4$ plasma treatment, and FIG. 2B shows crystal grains of a pentacene thin film stacked on an electrode layer which is subject to a $CF_4$ plasma treatment. FIG. 2B is an image observed after surface treatment under a 30 W $CF_4$ plasma environment.

As shown in FIGS. 2A and 2B, the crystal grains in FIG. 2B are smaller than the crystal grains in FIG. 2A. This is because the $CF_4$ plasma treatment decreases the size of the crystal grains of the first common layer (see CL1 of FIG. 1) to obtain a more dense crystal structure. As the size of the crystal grains decreases, an interfacial adhesive force between the first common layer (CL1) containing pentacene and the first electrode layer (see ED1 of FIG. 1) increases. Holes are therefore free to move through the interface to enhance the flow of current. Since it becomes possible to control the hole mobility in the interface through the $CF_4$ plasma treatment, the device may be driven at a lower voltage. Description will be made with reference to FIG. 3 so as to compare variations in characteristic of an organic light emitting device according to the grain size of the first common layer (CL1).

Figure 3:
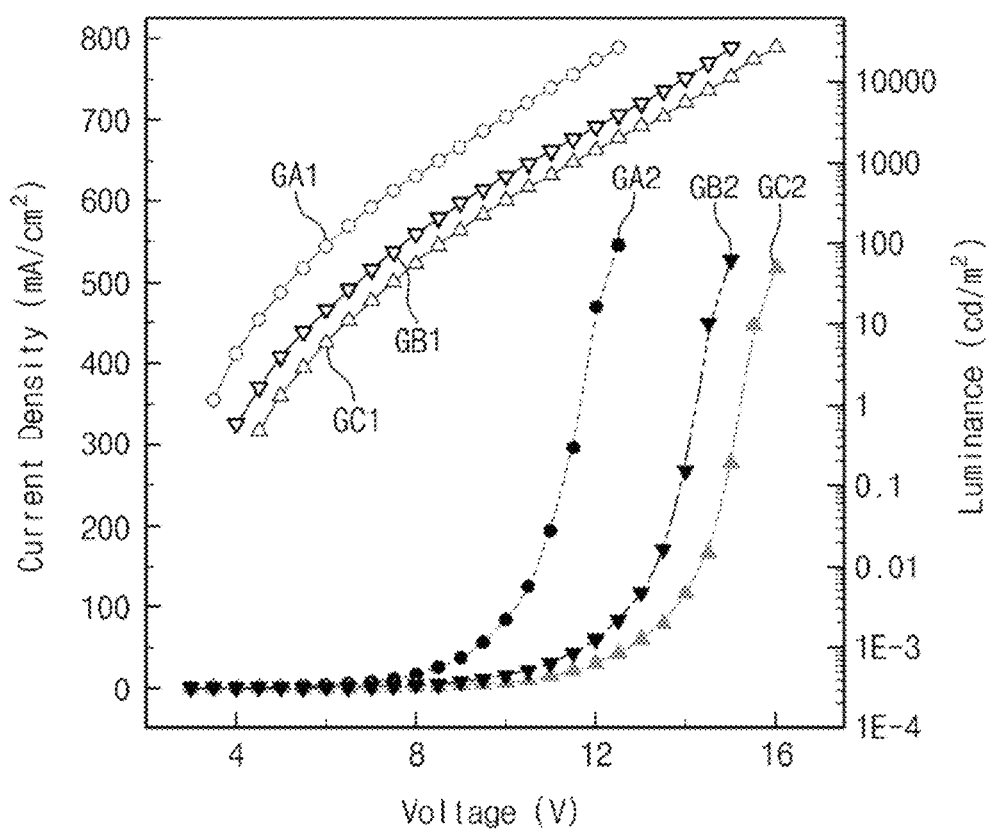
FIG. 3 is a graph showing voltage-current density-luminance characteristics of an organic light emitting device constructed as an embodiment according to the principles of the present invention.

In the graph of FIG. 3, first plots (GA1 and GA2) exhibit characteristics of an organic light emitting device constructed as an embodiment according to the principles of the present invention. The organic light emitting device disclosed herein includes a first electrode layer (see ED1 of FIG. 1) which is subject to the surface treatment, and a first common layer (see CL1 of FIG. 1) containing pentacene. In the graph of FIG. 3, the second plots (GB1 and GB2 ) exhibit characteristics of an organic light emitting device including a first electrode layer which is not subject to the surface treatment, and a first common layer (CL1) containing pentacene and disposed on the first electrode layer. In the graph of FIG. 3, the third plots (GC1 and GC2) exhibit characteristics of an organic light emitting device including a first electrode layer which is not subject to the $CF_4$ plasma treatment, and a first common layer (CL1) containing NPB (N,N'-diphenyl-N,N'-bis(1-naphthyl)-(1,1'-biphenyl)-4,4'-diamine) and disposed on the first electrode layer (ED1).

The organic light emitting devices corresponding to the plots (GA1, GB1, GC1, GA2, GB2, and GC2) in the graph of FIG. 3 have the same structure except for the configuration of the first common layer (CL1). The first common layer (CL1) is disposed on the first electrode layer (ED1) containing indium tin oxide and disposed on a glass substrate, and includes a hole injection layer. On the first common layer (CL1), a hole transport layer containing NPB (N,N'-diphenyl-N,N'-bis(1-naphthyl)-(1,1'-biphenyl)-4,4'-diamine) is disposed. An organic light emitting layer (see EML of FIG. 1) containing tris(8-quinolinolate)aluminum is disposed on the hole transport layer. A hole blocking layer containing 2,9-dimethyl-4,7-diphenyl-1,10-phenanthroline (BCP) is disposed on the organic light emitting layer. An electron transport layer containing tris(8-quinolinolate)aluminum is disposed on the hole blocking layer. An electron injection layer containing lithium fluoride is disposed on the electron transport layer. A second electrode layer (see ED2 of FIG. 1) containing alumium is disposed on the electron injection layer.

FIG. 3 is a graph showing luminance plots (GA1, GB1, and GC1) and current density plots (GA2, GB2 and GC2) according to the voltage applied to the respective OLEDs.

First, the plots (GA1, GB1 and GC1) showing the variation in luminance according to the voltage has a tendency that the luminance increases in proportion to the voltage. The first plot (GA1) exhibits a higher luminance than the second plot (GB1) and the third plot (GC1) under the same applied voltage. From those results, when it is assumed that the luminance is the same, it may be known that the first plot (GA1) has the lowest voltage to compared with the second plot (GB1) and the third plot (GC1).

Next, in the plots (GA2, GB2, and GC2) showing the variation in current density according to the voltage, the current density starts to sharply increase as the voltage increases beyond the critical voltage values. Since the existence of the current density indicates that current flows through a device, minimum voltages for driving OLED devices may be known through the graph of FIG. 3. As shown in FIG. 3, the current density in the second and third plots (GB2 and GC2) starts to sharply increase at about 12 V, whereas the current density in the first plot (GA2) starts to sharply increase at about 8 V that is lower than the critical voltage of the second and third plots (GB2 and GC2). From the graph of FIG. 3, it may be known that the OLEDs corresponding to the first plots (GA1 and GA2) have the lowest driving voltages.

The current density has a relationship with quantum efficiency and luminous efficiency. The quantum efficiency is a representative factor exhibiting the luminous efficiency. The external quantum efficiency has a tendency to sharply increase when an OLED emits light since the injection of electrons and holes is rapidly balanced with the transport of electrons and holes. The current density is generated by the injection/transport of electrons and holes, so that the charge balance is achieved to emit light. The lower the driving voltage and the higher the light intensity is under the same voltage, the higher the luminous efficiency is.

Resultantly, it may be known that when the first common layer contains pentacene and the first electrode is subject to a $CF_4$ plasma treatment, the OLED has enhanced luminous efficiency. Due to a complex interaction of $CF_4$ plasma and the pentacen organic layer, the injection/transport capability of holes is enhanced. Thus, it becomes possible to fabricate an organic light emitting device with enhanced luminous efficiency.

FIGS. 4A through 4G are cross-sectional views illustrating a method for to fabricating an organic light emitting device constructed as an embodiment according to the principles of the present invention.

Figure 4A:
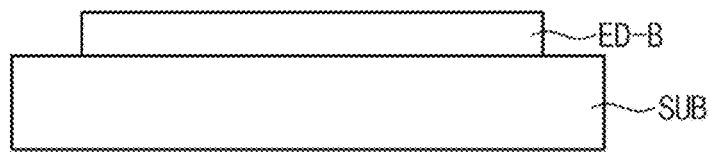
FIGS. 4A through 4G are cross-sectional views illustrating a method for fabricating an organic light emitting device according to an embodiment of the present invention.

As illustrated in FIG. 4A, a first electrode layer (ED-B) is formed on a substrate (SUB). Concretely, the first electrode layer (ED-B) is formed of a transparent conductive oxide on the substrate (SUB) by coating, evaporation, vapor deposition, electron beam deposition or sputtering. The forming of the first electrode (ED-B) is not limited to the above-mentioned techniques. The shape, structure and size of the first electrode layer (ED-B) are not particularly limited and may be properly selected according to the use and purpose of the organic light emitting device. The first electrode layer (ED-B) may be formed after washing of the substrate (SUB) is performed.

Figure 4B:
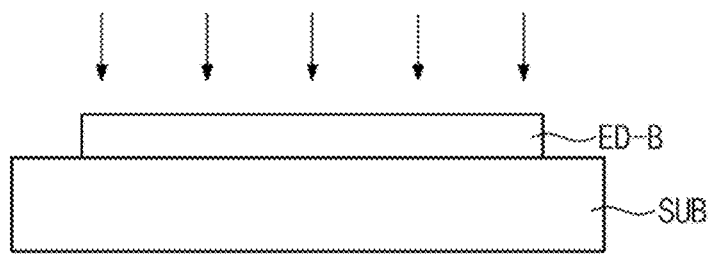
Figure 4C:
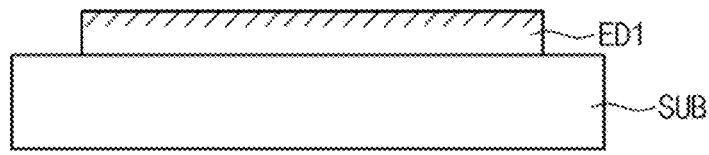

Thereafter, the first electrode layer (ED-B) is subject to a surface treatment as illustrated in FIGS. 4B and 4C. The surface treatment of the first electrode layer is performed by using $CF_4$ plasma. The $CF_4$ plasma surface treatment is performed in a chamber having a pressure adjustable function. After a $CF_4$ gas is injected into the chamber under an adjusted pressure, an RF AC power is applied to the chamber. The applied RF AC power increases kinetic energy of $CF_4$ gas molecules so that the $CF_4$ gas molecules are activated. The activated $CF_4$ gas molecules are separated into ions, electrons, and radicals through ionization decomposition to thus form plasma. The radicals randomly move due to diffusion, and the ions or electrons move in a direction where the electric field is applied. The direction of the electric field is periodically changed by the AC voltage. Thus, the surface of the first electrode layer (ED-B) reacts with the radicals, the ions or the electrons, physically and chemically. The first electrode layer (ED1) having an upper surface which has been subject to the $CF_4$ plasma treatment is illustrated in FIG. 4C. The $CF_4$ plasma treatment decreases the size of the crystal grains of the common layer (CL1) to be formed on the first electrode layer (ED1). As the grain size decreases, the mobility of hole passing through an interface between the first electrode layer (ED1) and the first common layer (CL1) is enhanced.

Figure 4D:
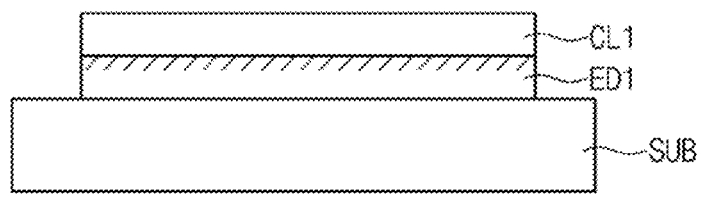

As illustrated in FIG. 4D, the first common layer (CL1) is stacked on the first electrode layer (ED1) which has been subject to the $CF_4$ plasma treatment. The first common layer (CL1) includes pentacene. The first common layer (CL1) containing pentacene deposited on the first electrode layer (ED1) which is subject to the $CF_4$ plasma treatment has smaller grains in size than the first common layer (CL1) deposited on a first electrode layer (ED-B) which is not subject to the $CF_4$ plasma treatment, so that the injection characteristic of holes is enhanced.

The first common layer (CL1) may be formed by various processes, for example, dry layer forming processes, such as chemical vapor deposition, thermal deposition, or sputter deposition, or coating processes, such as inkjet coating, nozzle coating, bar coating, slit coating, sping coating, deep coating, gravure coating, spray coating, or langmuir blodgett coating, or printing processes. Meanwhile, the first common layer (CL1) may include a plurality of layers. The plurality of players for the first common layer (CL1) may be sequentially stacked by the above-mentioned processes.

Figure 4E:
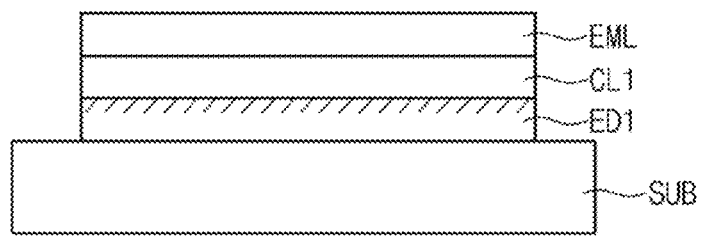
Figure 4F:
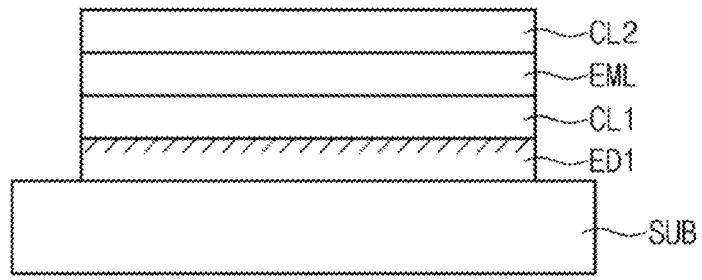

As illustrated in FIG. 4E, an organic light emitting layer (EML) is forme on the first common layer (CL1). As illustrated in FIG. 4F, a second common layer (CL2) is forme on the organic light emitting layer (EML). The organic light emitting layer (EML) and the second common layer (CL2) may be formed by using various processes, such as vacuum evaporation, spin coating, casting, langmuir blodgett, or the like. The second common layer (CL2) may include a plurality of layers. The plurality of players for the second common layer (CL2) may be sequentially stacked by the above-mentioned processes.

Figure 4G:
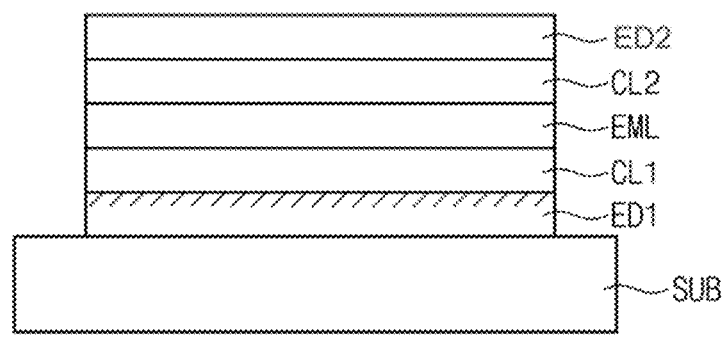

As illustrated in FIG. 4G, a second electrode layer (ED2) is formed on the second common layer (CL2). The second electrode layer (ED2) may be formed by a wet to method, such as printing, coating, or the like, or a dry method, such as vacuum evaporation, sputtering, ion plating, chemical vapor deposition, plasma deposition, or the like.

The method of forming the second electrode layer (ED2) may be selected according to the electrode material, and when two or more metals are used, the second electrode may be formed by simultaneously or sequentially the two or more metals. The material for the second electrode layer may be one selected from the group consisting of metals, alloys, electrical conductive compounds and mixtures thereof.

Figure 5:
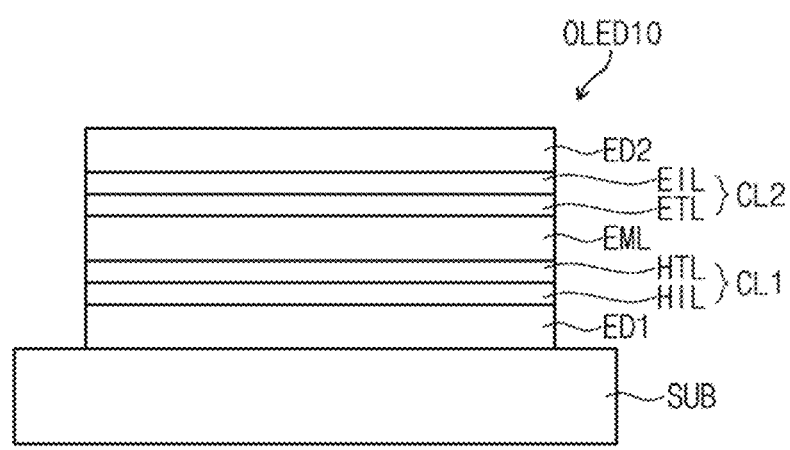
FIG. 5 is a cross-sectional view of an organic light emitting device constructed as an embodiment according to the principles of the present invention.

FIG. 5 is a cross-sectional view of an organic light emitting device constructed as an embodiment according to the principles of the present invention.

The organic light emitting devices according to the present embodiment have the same configuration as those described with reference to FIGS. 1 through 4G except for the configurations of the first common layer and the second common layer. Thus, like reference numerals are assigned to elements that are the same as in the embodiments described with reference to FIGS. 1 through 4G, and detailed description thereof will be omitted.

As illustrated in FIG. 5, the first common layer (CL1) of an organic light emitting device (OLED10) further includes a hole transport layer (HTL) disposed on a hole injection layer (HIL). The second common layer (CL2) of the organic light emitting device (OLED10) further includes an electron transport layer (ETL) disposed between the electron injection layer (EIL) and the organic light emitting layer (EML).

The hole transport layer (HTL) of the first common layer (CL1) may further include a hole transport layer (HTL) decreasing an energy level difference between the hole injection layer (HIL) and the organic light emitting layer (EML) so as to increase the mobility of hole injected into the first electrode layer (ED1).

The hole transport layer (HTL) may be formed in the same manner as the hole injection layer (HIL). The hole transport layer (HTL) may be formed on the hole injection layer (HIL) by various processes, for example, dry layer forming processes, such as chemical vapor deposition, thermal deposition, or sputter deposition, or coating processes, such as inkjet coating, nozzle coating, bar coating, slit coating, sping coating, deep coating, gravure coating, spray coating, or langmuir blodgett coating, or printing processes.

The electron transport layer (ETL) may be formed in the same manner as the electron injection layer (EIL). The electron transport layer (ETL) may be formed on the organic light emitting layer (EML) by various methods, such as vacuum evaporation, spin coating, casting, Langmuir blodgett, or the like.

Of the factors determining the luminous efficiency of an organic light emitting device, charge balance and exciton generation efficiency have the greatest influence on the mobility of electron/hole flowing through the organic light emitting device. When electrons and holes injected from the respective electrodes are combined to generate excitons, non-combined carriers (charges) become a non-recombined current component directed toward an opposite electrode and thus become a cause of light loss. Therefore, the mobility of electron/hole should be controlled so as to obtain the charge balance, which becomes a reason of determining the material for the electron transport layer (ETL).

The electron transport layer (ETL) may include 4,7-diphenyl-1,10-phenanthroline so as to increase the mobility of electron. The electron mobility of the electron transport layer (ETL) containing 4,7-diphenyl-1,10-phenanthroline is balanced with the hole mobility of the first common layer (CL1) described with reference to FIGS. 1 through 4G. The exciton generation efficiency may be enhanced through such a balance.

4,7-diphenyl-1,10-phenanthroline has the more improved electron mobility than other known materials for electron transport layer (ETL), for example, quinoline derivatives, TAZ, Balq, tris(8-quinolinorate)aluminum, and the like. The change in characteristics of the electron transport layer (ETL) according to the material will be described with reference to FIGS. 6A and 6B.

Figure 6A:
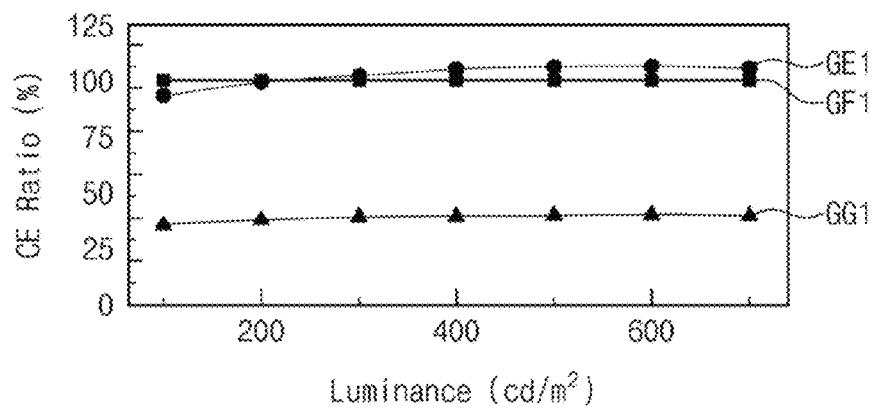
FIG. 6A is a graph showing luminance-current efficiency ratio of an organic light emitting device constructed as an embodiment according to the principles of the present invention.
Figure 6B:
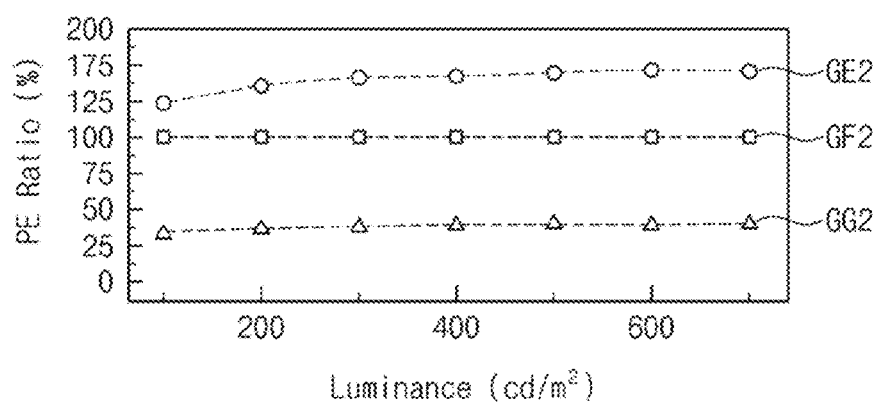
FIG. 6B is a graph showing luminance-power efficiency ratio of an organic light emitting device constructed as an embodiment according to the principles of the present invention.

FIG. 6A is a graph showing plots (GE1, GF1, and GG1) of luminance-current efficiency ratio according to the materials of the electron transport layer, and FIG. 6B is a graph showing plots (GE2, GF2, and GG2) of luminance-power efficiency ratio. The luminous efficiency characteristics of the organic light emitting devices may be found from the plots (GE1, GF1, GG1, GE2, GF2, and GG2).

In FIGS. 6A and 6B, the first plots (GE1 and GE2) exhibit characteristics of an organic light emitting device including the electron transport layer containing 4,7-dyphenyl-1,10-phenanthroline. In FIGS. 6A and 6B, the second plots (GF1 and GF2) exhibit characteristics of an organic light emitting device including the electron transport layer containing tris (8-quinolinorate)aluminum. In FIGS. 6A and 6B, the third plots (GG1 and GG2) exhibit characteristics of an organic light emitting device including the electron transport layer containing pentacene.

The organic light emitting devices having the plots (GE1, GF1, GG1, GE2, GF2, and GG2) shown in the graphs of FIGS. 6A and 6B have the same structures as those having the first plots (GA1 and GA2) shown in the graph of FIG. 3 except for the configuration of the electron transport layer.

As illustrated in FIG. 6A, the first plot (GE1) has a higher current efficiency than the second and third plots (GF1 and GG1) under the same luminance. As illustrated in FIG. 6B, the first plot (GE2) has a higher power efficiency than the second and third plots (GF2 and GG2) under the same luminance. That is, under the same luminance, the organic light emitting devices corresponding to the first plots (GE1 and GE2) consume a lower power than the organic light emitting devices corresponding to the second plots (GF1 and GF2) and the third plots (GG1 and GG2). Also, the organic light emitting devices corresponding to the first plots (GE1 and GE2) have a higher efficiency in power rather than in current than the organic light emitting devices corresponding to the second plots (GF1 and GF2).

In conclusion, the organic light emitting device which has the first common layer containing pentacene on the first electrode layer which has been subject to the $CF_4$ plasma treatment, and the electron transport layer containing 4,7-diphenyl-1,10-phenanthroline exhibits the most enhanced luminous efficiency characteristic.

Figure 7:
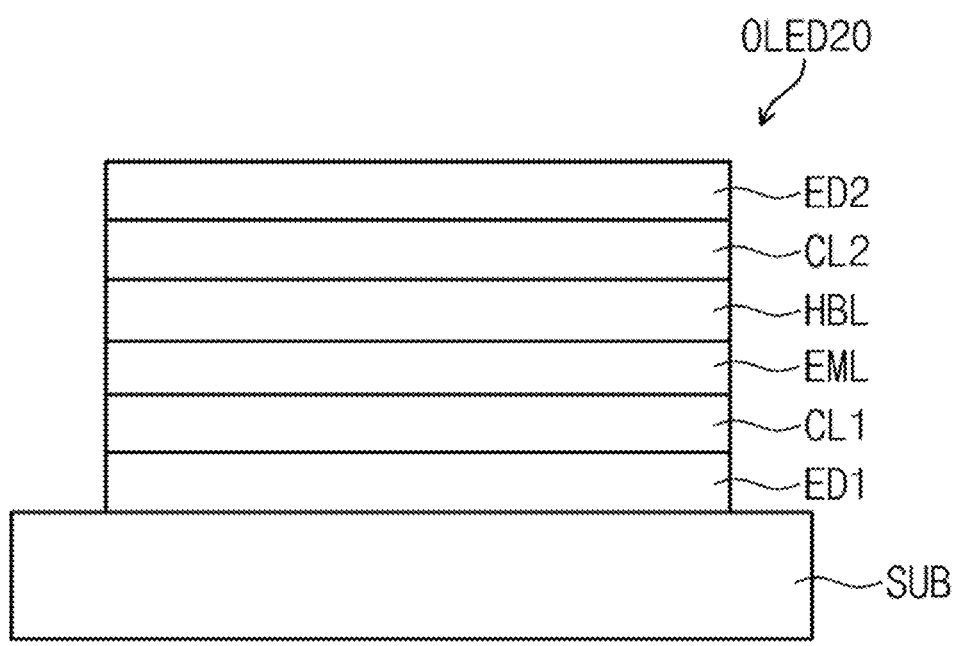
FIG. 7 is a cross-sectional view of an organic light emitting device constructed as an embodiment according to the principles of the present invention.

FIG. 7 is a cross-sectional view of an organic light emitting device (OLED20) fabricated according to an embodiment of the inventive concept. The organic light emitting device according to the present embodiment has the same configuration as those described with reference to FIGS. 1 through 4G except for the configurations of the first common layer (CL1) and the second common layer (CL2). Thus, like reference numerals are assigned to elements that are the same as in the embodiments described with reference to FIGS. 1 through 4G, and detailed description thereof will be omitted.

As illustrated in FIG. 7, the organic light emitting device (OLED20) further includes a hole blocking layer (HBL). The hole blocking layer (HBL) blocks holes from being diffused from the organic light emitting layer (EML) to the second common layer (CL2). Since the hole blocking layer (HBL)

allows holes to stay in the organic light emitting layer (EML), the exciton generation efficiency may be increased.

The hole blocking layer (HBL) may include oxadiazole derivatives, triazole derivatives, phenanthroline derivatives, 2,9-dimethyl-4,7-diphenyl-1,10-phenanthroline, or the like. The hole blocking layer (HBL) is disposed between the organic light emitting layer (EML) and the second common layer (CL2). The hole blocking layer (HBL) may be formed by various methods, for example, vacuum evaporation, spin coating, or the like.

As described above, a method for fabricating an organic light emitting device according to an embodiment of the present invention includes surface-treating the first electrode layer. The first electrode layer is surface-treated by using $CF_4$ plasma. The $CF_4$ plasma treating may improve the hole mobility in the first common layer stacked on the first electrode layer. As a result, injection/transport of charges in an interface between the first electrode layer and the first common layer may be smoothly performed. Thus, the luminous efficiency of the organic light emitting device may be enhanced to decrease power consumption.

According to another aspect of the present invention, methods for fabricating an organic light emitting device include forming the electron transport layer of 4,7-diphenyl-1,10-phenanthroline. By doing so, the electron transport layer has high charge mobility, so that charge balance is achieved. Thus, the generation efficiency of excitons is enhanced and thus power efficiency is enhanced too.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, the scope of the invention is defined not by the detailed description of the invention but by the appended claims, and all differences within the scope will be construed as being included in the present invention.

What is claimed is:

1. A method of fabricating an organic light emitting device, the method comprising:
   forming a first electrode layer on a substrate;
   surface-treating the first electrode layer with $CF_4$ plasma;
   forming a first common layer directly on the surface-treated first electrode layer and the first common layer comprising a pentacene thin film, and decreasing sizes of crystal grains of the pentacene thin film by the surface-treating of the first electrode layer;
   forming an organic light emitting layer on the first common layer;
   forming a second common layer on the organic light emitting layer; and
   forming a second electrode layer on the second common layer.

2. The method of claim 1, wherein the forming of the first common layer comprises stacking a hole injection layer on the surface-treated first electrode layer, and wherein the hole injection layer forms an interface with the surface-treated first electrode layer.

3. The method of claim 2, wherein the forming of the first common layer further comprises stacking a hole transport layer on the hole injection layer.

4. The method of claim 2, wherein the forming of the second common layer further comprises stacking an electron injection layer on the organic light emitting layer.

5. The method of claim 2, wherein the forming of the second common layer further comprises:
   stacking an electron transport layer on the organic light emitting layer; and
   stacking an electron injection layer on the electron transport layer.

6. The method of claim 5, further comprising forming a hole blocking layer blocking movement of holes from the organic light emitting layer to the electron transport layer between the electron transport layer and the organic light emitting layer.

7. The method of claim 2, further comprising forming a hole blocking layer blocking movement of holes from the organic light emitting layer to the second common layer between the forming of the organic light emitting layer and the forming of the second common layer.

8. The method of claim 2, wherein the first common layer is formed by a dry layer process.

9. The method of claim 8, wherein the dry layer forming process is one of the processes selected from the group consisting of chemical vapor deposition, thermal deposition, and sputter deposition.

10. The method of claim 1, wherein the second common layer contains 4,7-diphenyl-1,10-phenanthroline.

11. The method of claim 1, wherein the first electrode layer contains indium tin oxide.

12. A method of fabricating an organic light emitting device, the method comprising:
   forming a first electrode layer containing indium tin oxide on a substrate;
   surface-treating the first electrode layer with $CF_4$ plasma;
   forming a first common layer directly on the surface-treated first electrode layer by a dry layer forming process and the first common layer comprising a pentacene thin film, and decreasing sizes of crystal grains of the pentacene thin film by the surface-treating of the first electrode layer;
   forming an organic light emitting layer on the first common layer;
   forming a hole blocking layer on the organic light emitting layer;
   forming a second common layer on the hole blocking layer; and
   forming a second electrode layer on the second common layer, and
   wherein the first common layer forms an interface with the surface-treated first electrode layer, and
   wherein the electron transport layer contains 4,7-diphenyl-1,10-phenanthroline.

13. The method of claim 12, wherein the second common layer comprises an electron transport layer and an electron injection layer sequentially stacked.

14. The method of claim 12, wherein the dry layer forming process is one of the processes selected from the group consisting of chemical vapor deposition, thermal deposition, and sputter deposition.

* * * * *